(12) United States Patent
Park

(10) Patent No.: US 6,416,556 B1
(45) Date of Patent: Jul. 9, 2002

(54) STRUCTURE AND METHOD OF OPERATING AN ARRAY OF NON-VOLATILE MEMORY CELLS WITH SOURCE-SIDE PROGRAMMING

(75) Inventor: Eungjoon Park, Fremont, CA (US)

(73) Assignee: Azalea Microelectronics Corporation, Santa Clara, CA (US)

( * ) Notice: Subject to any disclaimer, the term of this patent is extended or adjusted under 35 U.S.C. 154(b) by 0 days.

(21) Appl. No.: 09/757,088

(22) Filed: Jan. 8, 2001

(51) Int. Cl.$^7$ ............................................. G11C 11/34
(52) U.S. Cl. ........................... 3652/185.28; 365/185.18
(58) Field of Search ....................... 365/185.28, 185.18

(56) References Cited

U.S. PATENT DOCUMENTS 6,222,227 B1 * 4/2001 Chen ..................... 365/185.01

* cited by examiner

Primary Examiner—M. Tran
(74) Attorney, Agent, or Firm—Townsend and Townsend and Crew LLP

(57) ABSTRACT

An array of non-volatile memory cells are arranged along rows and columns. Each memory cell has a drain region spaced apart from a source region to form a channel region therebetween. The drain region has a greater depth than the source region. Each memory cell further includes a stack of floating gate and select gate extending over the channel region. The select gate of the cells along each row are connected together to form a wordline. Each of a number of data lines is coupled to the drain regions of at least a portion of a column of cells. Each of a number of source lines is coupled to a source region of a plurality of cells along at least a portion of a row of cells. In such a memory array, a selected memory cell is biased so that a threshold voltage of the selected memory cell is increased by injection of hot electrons from a portion of the channel region near the source region to the floating gate.

16 Claims, 5 Drawing Sheets

| Mode | Selected WL | Unselected WL | Selected DL | Unselected DL | Selected SL | Unselected SL | Selected Bulk | Unselected Bulk |
|---|---|---|---|---|---|---|---|---|
| Erase | -10V | Vss | 5V | Float | Float | Float | Vss | Vss |
| Erase VF | VH1 | Vss | 0.7V | Float | Vss | Float | Vss | Vss |
| Program | 5V | -5V | -5V | Float | Vss | Float | -5V | Vss |
| Program VF | VH2 | Vss | 0.7V | Float | Vss | Float | Vss | Vss |
| Read | Vcc | Vss | 0.7V | Float | Vss | Float | Vss | Vss |

FIG. 6

STRUCTURE AND METHOD OF OPERATING AN ARRAY OF NON-VOLATILE MEMORY CELLS WITH SOURCE-SIDE PROGRAMMING

BACKGROUND OF THE INVENTION

The present invention relates in general to semiconductor memories and in particular to a non-volatile memory array architecture and a method of operation of the same.

The most common variety of non-volatile memories, such as EPROM, flash memory, and some EEPROMs, today employs channel hot electron (CHE) for programming and negative gated Fowler-Nordheim (FN) tunneling for erase. FIG. 1 shows a conventional n-channel stack gate flash memory cell 100. Memory cell 100 includes N+ source 102 and drain 103 regions spaced apart in a P-type silicon substrate 101 to form a channel region 104 therebetween. A floating gate 105 of polycrystalline silicon material is laid on top of a tunneling dielectric 106, which extends over the channel region 104 and overlaps the source 102 and drain 103 regions. Stacked on top of, but insulated from, floating gate 105 is a gate 107 of polycrystalline material. Junction 102 is made deeper than normal in order to minimize the adverse reliability effects of tunnel oxide hot hole trapping during erase operation.

Cell 100 is programmed, i.e., its threshold voltage is raised higher, by applying 10V to gate 107, 5V to drain 103, and grounding source 102. The memory cell is thus strongly turned on, and the cell's threshold voltage is raised due to injection of hot electrons from the channel region near the drain 103 to floating gate 106, as indicated by the arrow labeled as "P". Cell 100 is erased, i.e., its threshold voltage is lowered, by applying –10V to gate 107, 5V to source 102, and floating drain 103. The cell's threshold voltage is thus lowered due to tunneling of electrons from the floating gate 105 to source 102, as indicated by the arrow labeled as "E".

Conventional memory arrays include a matrix of memory cells arranged along rows and columns. The gates of the cells along each row are connected together forming a wordline. In one array architecture, the cells along each column are grouped in a number of segments, and the drains of the cells in each segment are coupled to a corresponding segment line. The segment lines along each column are coupled to a corresponding data line through one or more segment select transistors. The segmentation of the cells in each column helps reduce the bitline capacitance to that of the metal bitline plus the small capacitance of a selected segment line. Performance of the memory is thus improved.

During programming or read operations, one or more bitlines are selected through a column select circuit for transferring data to or from the selected memory cells. The column select circuit typically has a multiplexer configuration in that a group of serially-connected NMOS pass transistors controlled by column decoding signals selectively couple one or more bitlines to either sense amplifiers (read operation) or data-in buffers (programming operation). Depending on the total number of bitlines in the array and the number of bitlines to be selected, two or more levels of column selection need to be implemented in the column select circuit. The number of levels of column selection correspond to the number of serially-connected pass transistors that couple the selected bitlines to the sense amplifier or data-in buffer. For example, if two levels of column selection are implemented, a selected bitline will be coupled to the sense amplifier or data-in buffer through two serially-connected column select transistors.

The sizes of the column select transistors and the segment select transistors need to be made large enough so that the required cell programming voltage and current can be provided to the selected cell. Because of the programming biasing conditions, the serially connected segment select transistor and column select transistors result in a rather resistive path, which can be compensated for by increasing the transistor sizes. This can be more clearly understood with the help of FIG. 2.

FIG. 2 shows a portion 201 of an array along with a portion 202 of a column select circuit. The array portion 201 includes a memory cell 100 with its gate coupled to wordline WL and its drain coupled to a segment line S0. The source of cell 100 is shown as being connected to ground for simplicity, although, the source is typically connected to a source line which may be decoded to provide ground only to selected memory cells. A segment select transistor MS is coupled between segment line S0 and bitline BL, with its gate coupled to segment select signal SS. Bit line BL is coupled to the data-in block 204 through two serially connected column select transistors MYa and MYb. Column select transistors MYa and MYb are controlled by column decode signals Ya and Yb, respectively. As indicated in FIG. 2, the deeper source junction 102 of the FIG. 1 cell is connected to ground, while the shallower drain junction 103 is connected to segment line S0.

As can be seen, cell 100, and transistors MS, MYa, and MYb are serially-connected to data-in block 204. To program cell 100, 10V is supplied to wordline WL, while 5V needs to be supplied to its drain, i.e., to segment line S0. To supply 5V to segment line S0, data-in block 204 outputs 5V on line 206, and column select signals Ya and Yb as well as segment select signal SS are raised to 10V. Thus, the 5V on line 206 is transferred through transistors MYa, MYb, and MS to segment line S0. The drive capability of each transistor MYa, MYb, MS is, to a first order approximation, equal to its Vgs–Vt, wherein Vgs represents the transistor gate to source voltage, and Vt represents the transistor threshold voltage. For each of transistors MYa, MYb, MS, Vgs=Vg–Vs=10V–5V=5V, and the Vt is approximately 2V because of the back bias effect. Thus, for each transistor MYa, MYb, MS, Vgs–Vt=5V–2V=3V. Because of the small Vgs–Vt of 3V, the sizes of these transistors need to be made large so that sufficient current can be supplied to the cell during programming.

In higher density memories, where the number of levels in the column select circuit increases, the sizes of the column select transistors increase proportionally. This increases the die size. More importantly, as higher performance is required of memory devices, the need for further segmentation of the bitlines increases, resulting in a larger number of segment select transistors in the array. The adverse impact of a larger size segment select transistor and a larger number of segment select transistors on the overall die size can be rather substantial.

FIG. 3 illustrates another draw back of conventional memory arrays, namely, the non-uniform programming characteristic of memory cells in the array due to the source resistance. A portion 300 of a memory array is shown as including 16 memory cells 100-0 to 100-15 along a row. The drain of each cell is coupled to a corresponding segment line S0 to S15, and the gates of the cells are connected to a wordline WL. The sources of the cells are connected together and to metal source lines SLn and SLn+1 through a diffusion strip 310. Resistors R0 to R16 depict the resistance associated with the diffusion strip 310. The cell configuration of FIG. 3 is repeated as many times as required to form the entire array.

For the above-indicated cell biasing during programming, the cell programming performance is dependent primarily upon the gate to source voltage Vgs of the cell. For example, with the wordline WL at 10V, and the source fully grounded, the cell Vgs equals a full 10V. However, because of the presence of the resistive diffusion strip 310, depending on the location of the cells along the diffusion strip 310, the effective Vgs of the cells vary. For example, of the 16 cells, the cells closest to the center of the diffusion strip will have the maximum source resistance, and thus poorer programming characteristics, while the cells closest to the ends of the diffusion strip 310 have minimum source resistance, and thus the best programming characteristics. This leads to the undesirable non-uniform programming characteristics of the cells across the array.

Thus, an array architecture and method of operation are needed whereby the adverse effect of column select and segment select transistor sizes on the die size can be minimized, while a more uniform programming characteristic across the array cells can be obtained.

SUMMARY OF THE INVENTION

In accordance with an embodiment of the present invention, an array of non-volatile memory cells are arranged along rows and columns. Each memory cell has a drain region spaced apart from a source region to form a channel region therebetween. The drain region has a greater depth than the source region. Each memory cell further includes a stack of floating gate and select gate extending over the channel region. The select gate of the cells along each row are connected together to form a wordline. Each of a number of data lines is coupled to the drain regions of at least a portion of a column of cells. Each of a number of source lines is coupled to a source region of a plurality of cells along at least a portion of a row of cells. In such a memory array, a selected memory cell is biased so that a threshold voltage of the selected memory cell is increased by injection of hot electrons from a portion of the channel region near the source region to the floating gate.

In another embodiment, a selected memory cell is biased so that a threshold voltage of such selected memory cell is decreased by tunneling of electrons from the floating gate to the drain region.

In another embodiment, the threshold voltage of the selected cell is increased by applying a negative voltage to a selected data line to which the drain of the selected memory cell is coupled, a positive voltage to a word line to which the selected gate of the selected memory cell is coupled, and a reference voltage to a source line to which the source of the selected memory cell is coupled.

In another embodiment, a magnitude of a negative voltage applied to unselected wordlines is greater than a magnitude of the negative voltage applied to the selected data line.

In another embodiment, the cells along each column are grouped in a number of segments, and the drains of the cells in each segment are coupled together through a segment interconnect. The memory array further includes segment select transistors, each segment select transistor being configured to couple a segment interconnect to a corresponding data line when selected.

In another embodiment, the segment select transistors are NMOS transistors. In yet another embodiment, the data to be transferred to or from the memory cells is provided on the data line.

BRIEF DESCRIPTION OF THE DRAWINGS

FIG. 6 is a table indicating an exemplary set of biasing conditions for different operating modes.

DESCRIPTION OF THE SPECIFIC EMBODIMENTS

Figure 4:
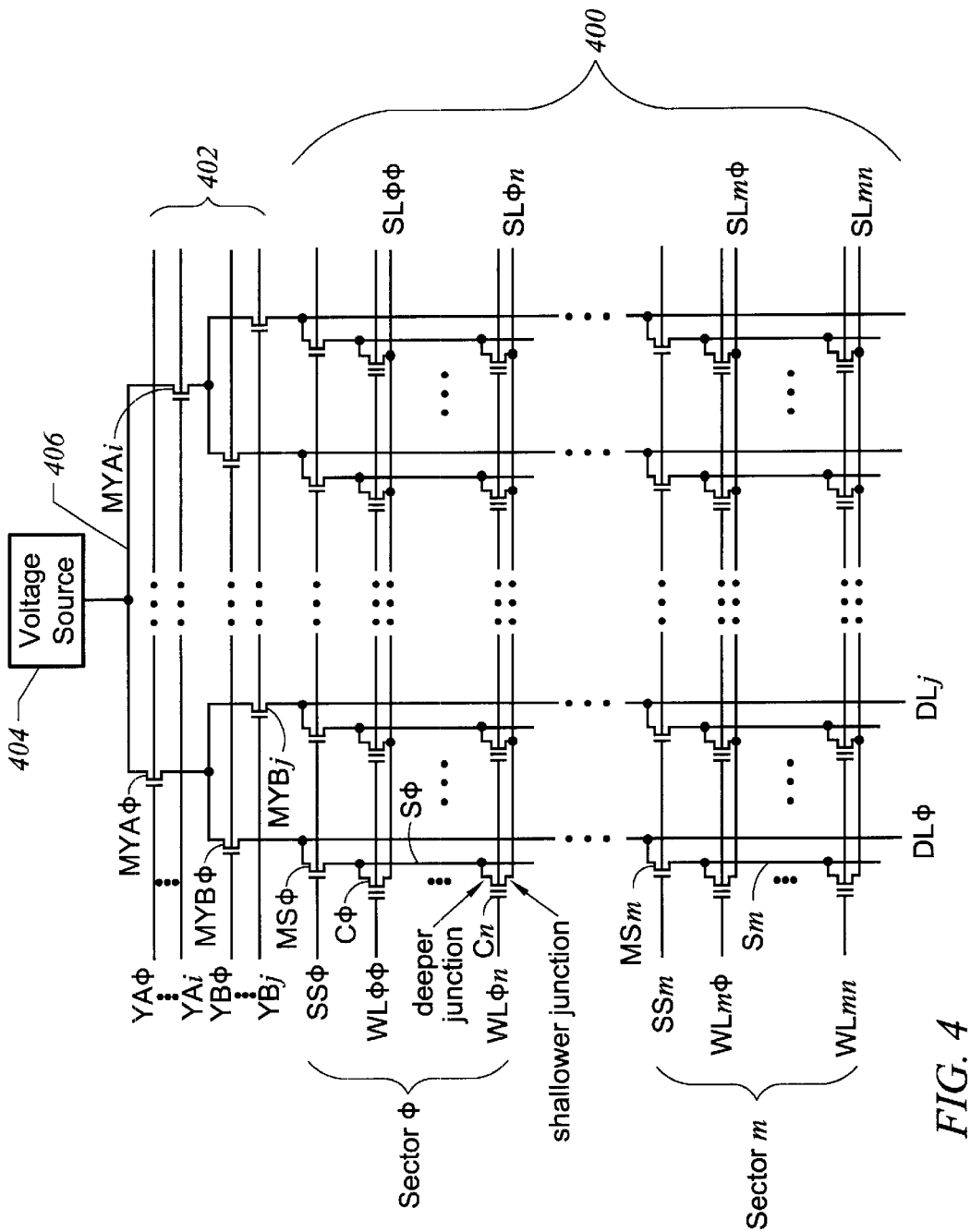
FIG. 4 is a simplified diagram of a memory array and an associated column selection circuit in accordance with one embodiment of the present invention.

FIG. 4 is a simplified diagram of a memory array 400 and an associated column selection circuit 402 in accordance with one embodiment of the present invention. Array 400 includes a matrix of non-volatile memory cells arranged along rows and columns. The gates of the cells along each row are connected to a wordline, e.g., the cells along the top row are connected to wordline WL00. The sources of the cells along each row are coupled to a corresponding source line SL extending parallel to the wordlines. For example the sources of the cells along the top row are connected to source line SL00.

The cells along each column are grouped in a number of segments, wherein the drains of the cells in each segment are coupled together through a corresponding segment interconnect. For example, the drains of cells C0–Cn are connected together though segment interconnect S0. The segment interconnects along each column are coupled to corresponding data lines DL through one or more segment select transistors. For example, segment interconnects S0 to Sm along one column are coupled to DL0 through the respective MS0 to MSn transistors, as shown. The segment select transistors MS are controlled by segment select signals on segment select lines SS0 to SSm. Segment select signals are decoded such that during a read or a programming operation only one of the segment select signals is raised high. As such only the row of segments in which the selected cell resides are coupled to the corresponding DL lines in a read or programming operation.

Data lines are coupled to a voltage source 404 (e.g., a charge pump circuit or an externally provided power supply) through the column select circuit 402. Voltage source 404 supplies the required programming and erase voltages to line 406 for transfer to the selected data lines DL. Line 406 is also connected to other circuitry such as sense amplifier and data-in buffer, not shown. Two levels of column selection are show in FIG. 1, although more or less levels may be used depending on the total number of bitlines in the array. The first level of decoding includes two or more sets of column select transistors MYB0 to MYBj for selecting a data line from each group of data lines DL0 to DLj. The second level of decoding includes transistors MYA0 to MYAi for selecting one of i+1 preselected data lines.

The cells coupled to each row of segment interconnects form a sector, as shown by sectors 0 to m in FIG. 4. In one embodiment, the cells in each sector are formed in a bulk region (not shown) which can be biased independently from each of the other sector bulk regions. Note that this sector configuration is intended to be illustrative and not limiting. Clearly, other sector configurations may be arranged depending on the design goals and technology limitations, as is well known to those skilled in this art.

Figure 1:
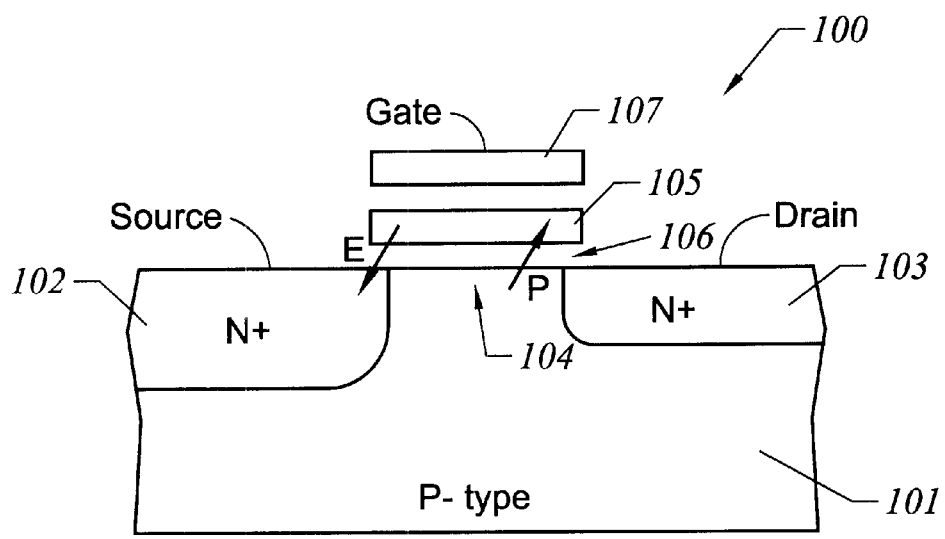
FIG. 1 shows a conventional n-channel stack gate flash memory cell.
Figure 2:
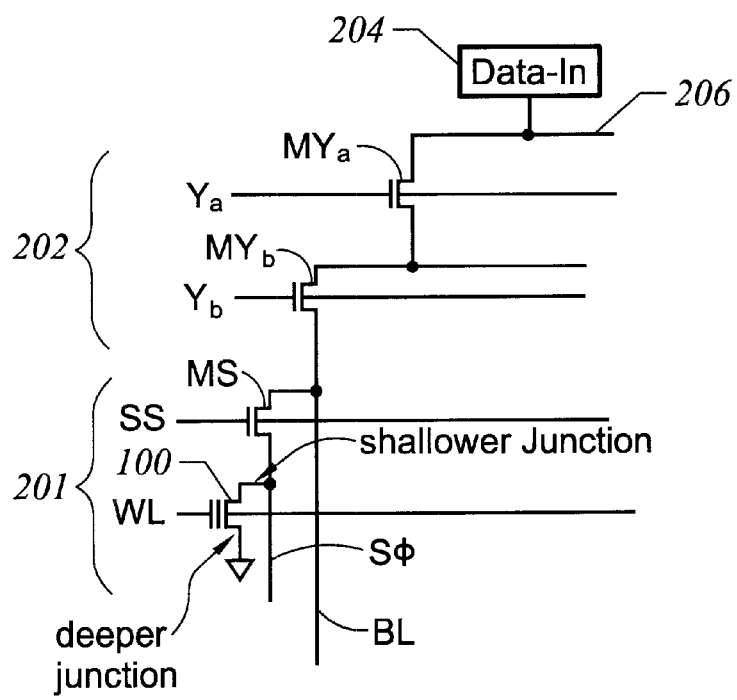
FIG. 2 shows a portion of a memory array along with a portion of a column select circuit of a conventional memory.

In one embodiment, each memory cell in FIG. 4 has a cell structure similar to that shown in FIG. 1, however, contrary to the FIG. 1 cell, junction 103 forms the cell source in the FIG. 4 array, and junction 102 forms the cell drain. The "cell drain" is hereby defined as the cell junction which is connected to the "array line" on which programming and read data are provided. In the FIG. 4 embodiment, the "array line" corresponds to the data lines and their associated segment interconnects. Thus, as indicated for cell Cn in FIG. 4, the deeper junction of the memory cell is coupled to the segment interconnect S0, and thus forms the drain of cell Cn, while the shallower junction is coupled to source line SL0n.

The cell programming is described next using cell C0. In accordance with the invention, cell C0 is programmed, i.e., its threshold voltage is increased, through injection of hot electrons from a pinch-off point in the channel region near the source to the floating gate. This is achieved by applying a positive voltage to the selected wordline WL00, a negative voltage to the selected segment S0, and grounding source line SL00. Thus, contrary to the conventional approach described above, the potential on the cell drain is lower than the source, and as such the pinch off point in the channel region occurs near the source.

In one embodiment, cell C0 is programmed in accordance with the biasing indicated in the FIG. 6 table. 5V is applied to the selected wordline WL00, while −5V is applied to all unselected wordlines, −5V is applied to the selected data line DL 0 while all unselected data lines float, the selected source line SL00 is grounded while all unselected source lines float, and −5V is applied to the bulk region of the selected sector 0 while all other unselected bulk regions are grounded. Segment select line SS0 is selected (i.e., raised high to, for example, 5V) to transfer the −5V on data line DL0 to segment interconnect S0. All unselected segment select signals are biased to −5V. Further, the selected YA, YB signals are raised high (e.g., 5V) to transfer the −5V provided by voltage source 404 on line 406 to data line DL0. All unselected YA, YB signals are biased to −5V.

Under such biasing, cell C0 will have 10V across its gate to drain, and 5V across its source to drain. Thus, even though very different voltages are applied to the cell terminals than in conventional programming approach, the voltage magnitudes across the cell terminals are similar to those in conventional programming operation.

By applying a negative voltage(e.g. 31 5V) to the selected segment interconnect rather than the conventional +5V, the transistor drive of the selected segment select transistors MS and the selected column select transistors MY is substantially increased, allowing the sizes of these transistors to be reduced. In the above example, with the selected column decoded signals YA, Yb and the selected segment select line SS0 at 5V, and all nodes along the selected column path between line 406 and segment interconnect S0 at −5V, then, the transistor drive of each MS and MY transistors is roughly equal to Vgs−Vt=Vg−Vs−Vt=+5V−(−5v)−1V. The Vt of transistors MS and MY is 1V because contrary to the prior art approach, the sources of transistors MS and MY are at a negative voltage, which eliminates the threshold voltage degradation present in the prior art approach discussed above. Therefore, with a Vgs−Vt of 9V, as opposed to the mere 3V in the prior art approach, the size of MS and MY transistors can be substantially reduced, thus significantly improving the die size.

With both the unselected wordlines and the selected segment interconnect at −5V during programming, there may be an undesirable leakage current through the unselected erased cells coupled to the selected segment interconnect. Such leakage current, in effect, reduce the limited current drive of the charge pump, thus preventing the selected segment interconnect from reaching the target −5V. This results in longer programming time. If any of the above-mentioned unselected erased cells has an erase Vt<0V (e.g., has been over-erased), they would be weakly turned on since their Vgs=Vg−Vs=−5−(−5V)=0V would be greater than their erase Vt, thus, resulting in the leakage current. To eliminate the leakage current, it is necessary to modify the programming voltages indicated in the FIG. 6 table so that the unselected erased cells connected to the selected segment interconnect are turned off even if the they are over-erased. For example, applying −4V rather then −5V to the selected data line provides an over-erase tolerance of down to −1V Vt before the on set of the leakage current. In one embodiment, −5V is applied to the selected data line while −5.25V is applied to the unselected wordlines.

The sources of the cells along each row are connected together forming a continuous diffusion line extending parallel to the wordlines. To minimize the resistance associated with such diffusion line, each source diffusion line is strapped with metal line. For example, the source diffusion line along the top row of cells is strapped with a metal line, forming source line SL00. The metal line strap contacts the underlying diffusion line a predetermined number of times. In one embodiment, one contact every sixteen cells is used. Even though such strapping reduces the source line resistance, there still remains a finite amount of resistance associated with the sources of the cells. For example, the cell located an equal distance from its two neighboring source contacts has the maximum source resistance, while the cell closest to a source contact has the smallest source resistance.

Figure 3:
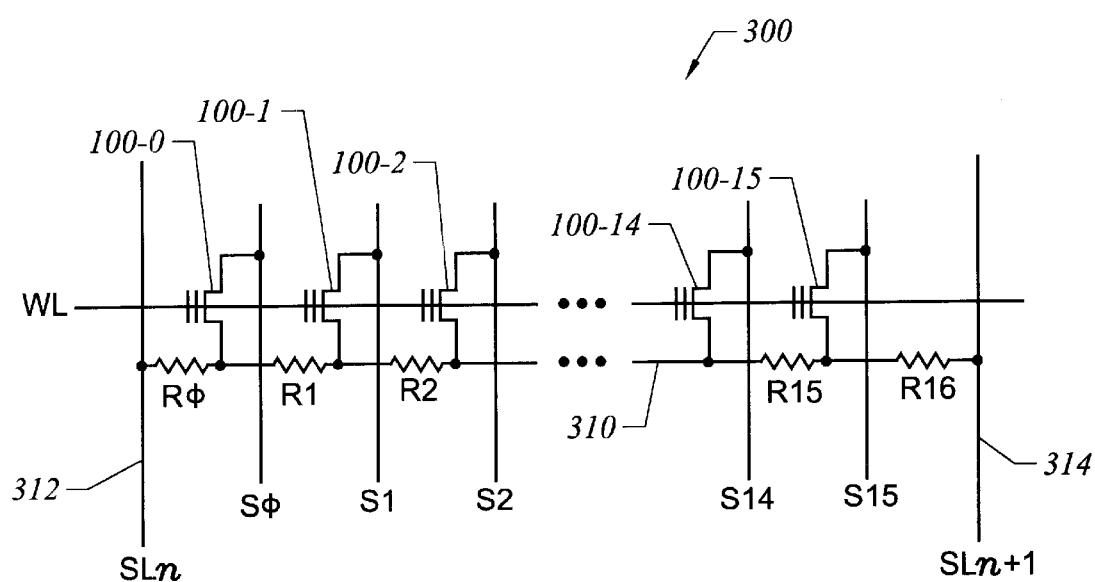
FIG. 3 shows the source connection of a group of cells along a row in a conventional memory array.

Thus, similar to the FIG. 3 array, each cell has a different source resistance depending on its proximity to the metal contact. However, unlike the prior art approach, the varying source resistance of the cells does not result in non-uniform programming characteristics. This is because in FIG. 4 the cell programming performance is primarily determined by the voltage across the gate to drain of each cell, and not the gate to source as in the FIG. 3 approach. Further, because the segment interconnects in FIG. 4 are from metal, no drain resistance variation exists either. Although the source resistance variation causes a variation in the voltage across the drain to source (Vds) of the cells, the impact of the Vds variation on uniformity of the programming characteristics is relatively small.

As indicated in the FIG. 6 table, in a read operation, Vcc (an externally provided supply voltage) is applied to the selected wordline WL, while all unselected wordlines are grounded; the selected data line is biased to 0.7V, while all unselected data lines float; the selected source line is grounded, while all unselected source lines float; and the all sector bulk regions are grounded. Note that Vcc is applied to the selected segment selected transistor and the selected YA and YB transistors, while all other unselected segment select transistors and YA and YB transistors are grounded. For example, cell C0 is read by applying Vcc to wordline WL00 and segment select line SS0, grounding source line SL00, and biasing the data line DL0 to 0.7 prior to sensing to state of cell C0.

In erase operation, cells are erased by electron tunneling from the floating gate to drain. In one embodiment, sector erase is achieved as follows. First, the state of the cells along a selected row in the selected sector are individually verified, and then, only those cells which verified as being programmed are erased. These steps are repeated until all rows of cells in the sleeted sector are erased. As indicated in the FIG. 6 table, to erase a cell verified as being programmed, −10V is applied to the selected wordline, while all unselected wordlines are grounded; 5V is applied to the selected data line, while the unselected data lines float; all source lines float; and all sector bulk regions are grounded. For example, cell C0 is erased by applying −10V to WL00, 5V to data line DL0, grounding the bulk region for sector 0 while all source lines float.

In the FIG. 6 table, the array biasing for two additional operating modes, namely, erase verify (erase VF) and program verify (program VF), are also shown. Program verify mode is entered after each programming cycle to determine if the target programming Vt is obtained. If not, additional programming cycles may be carried out. Similarly, erase verify mode is entered after each erase cycle to determine if the target erase Vt is obtained. If not, additional erase cycles may be carried out. The entries VH1 and VH2 represent verify voltages carefully selected to ensure sufficient programming and erase Vt margins.

Figure 5:
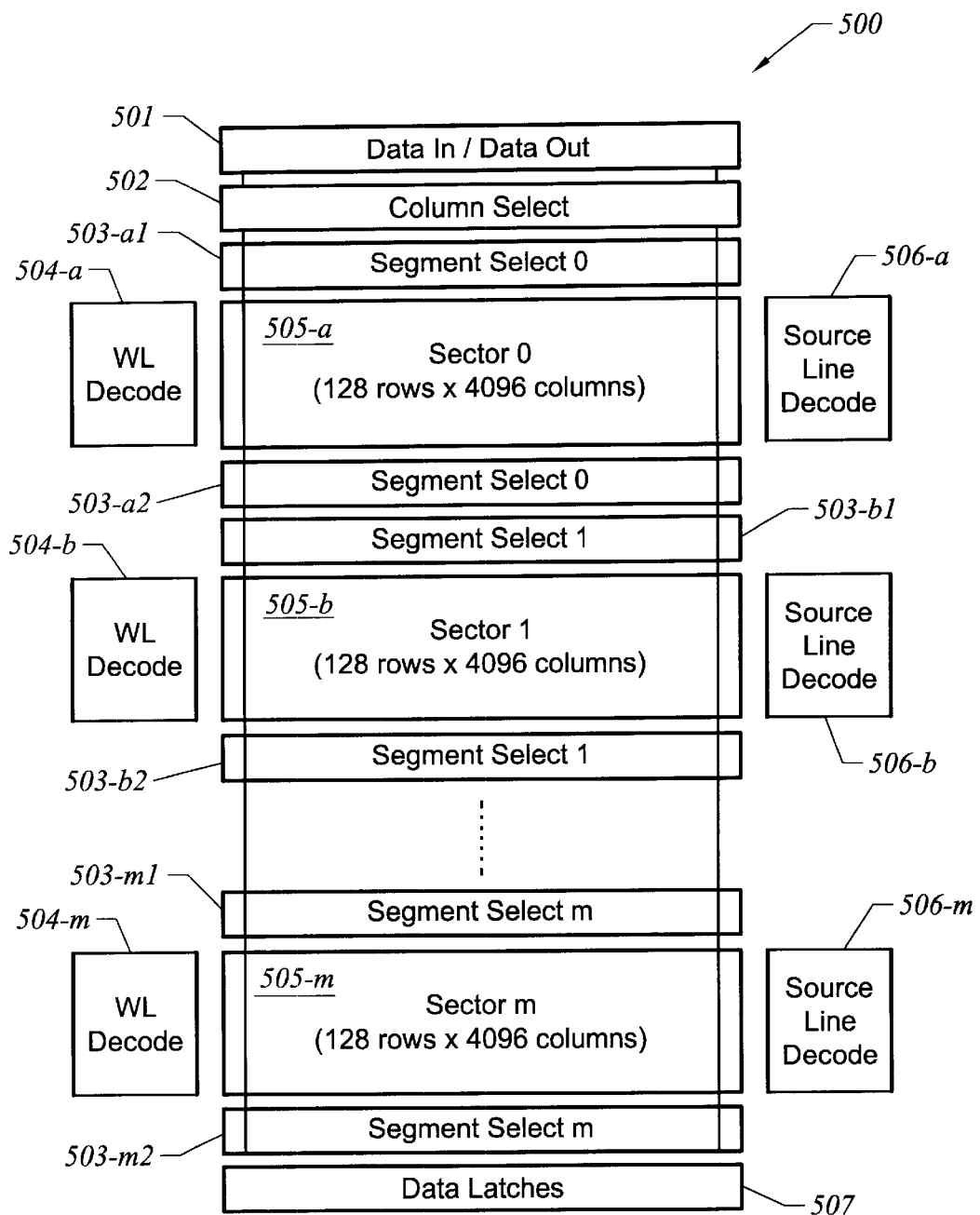
FIG. 5 shows an exemplary floor plan for a memory array and the periphery circuit blocks with which it interfaces.

FIG. 5 shows an exemplary floor plan 500 for a memory array and the periphery circuit blocks with which it interfaces. A total of m array sectors of 128 rows by 4096 columns each are shown. The size of the sectors is merely illustrative and not intended to be limiting. These sectors correspond to the sectors shown in FIG. 4. Each sector interfaces with a first segment select block located along its top side, a second segment select block located along its bottom side, a wordline decode block located along its left side, and source line decode block located along its right side.

As an example, sector 0 interfaces with the segment select 0 blocks 503-*a1* and 503-*a2* along its top and bottom sides, respectively. In the FIG. 5 embodiment, the segment select transistors coupled to segment select line SS0 (FIG. 4) are divided equally between the two blocks 503-*a1* and 503-*a2*. The segment select transistors in block 503-*a* are connected to every other segment interconnect in sector 0, while the segment select transistors in block 503-*a2* are connected to the alternate segment interconnects. The gates of the segment select transistors in both blocks 503-*a1* and 504-*a2* are connected to segment select signal SS0 (FIG. 4).

In an alternate embodiment, only one segment select block is provided for each sector, and thus all segment select transistors are provided in the same segment select block. In this embodiment, blocks 503-*a2*, 503-*b2*, and 503-*m2* in FIG. 5 are eliminated.

The wordline decode blocks 504-*a* to 504-*m* and the source line decode locks 506-*a* to 506-*m* collectively operate to select one wordline and a corresponding source line in one of the sectors during each of programming and read operations. In an erase operation, the wordline decode blocks select one row, however, no source line selection takes place since all source lines float during erase. The column select block 502 corresponds to the column select 402 of FIG. 4, and operates to select one data line during each of programming, read, and erase operations. Note that in FIG. 5, the data lines (not shown) run across all the sectors, similarly to data lines in FIG. 4.

The data in/data out block 501 includes sense amplifiers and output buffers (not shown) for a read operation, and data-in buffers for a write operation. Data latches block 507 includes one latch for each data line. These latches are used during an erase operation to store the state of the cells in the selected row. These latches are used in identifying which cells along the selected row do not need to be erased, i.e., were previously erased.

The biasing voltages indicated in the FIG. 6 table are illustrative only and not intended to be limiting. These biasing voltages can be altered depending on the design, device, and process requirements.

While the above is a complete description of preferred embodiments of the present invention, it is possible to use various alternatives, modifications, and equivalents. Therefore, the scope of the present invention should be determined not with reference to the above description but should, instead, be determined with reference to the appended claims, along with their full scope of equivalents.

What is claimed is:

1. An array of non-volatile memory cells arranged along rows and columns, comprising:
    a plurality of data lines, each data line being coupled to a drain terminal of a plurality of cells along a column;
    a plurality of source lines, each source line being coupled to a source terminal of a plurality of cells along a portion of a row, each memory cell having a channel region between its source and drain terminals; and
    a plurality of word lines, each word line being coupled to a gate terminal of a plurality of cells along a row;
    wherein one or more memory cells are biased so that a threshold voltage of the one or more biased memory cells is increased by channel hot electron injection from a portion of the channel region substantially near the source terminal to the floating gate.

2. The array of claim 1 wherein one or more cells are biased so that a threshold voltage of the one or more biased memory cells are decreased by fowler nordheim tunneling of electrons from the floating gate to the drain region.

3. The structure of claim 1 wherein the cells along each column are grouped in a number of segments, the drains of the cells in each segment being coupled together through a segment interconnect, the structure further including segment select transistors, each segment select transistor being configured to couple a segment interconnect to a corresponding data line when selected.

4. The structure of claim 3 wherein the segment select transistors are NMOS transistors.

5. The structure of claim 1 wherein data to be transferred to or from the memory cells is provided on one or more of the data lines.

6. A structure comprising:
    an array of non-volatile memory cells arranged along rows and columns, each memory cell having a drain region spaced apart from a source region to form a channel region therebetween, the drain region having a greater depth than the source region, each memory cell further having a stack of floating gate and select gate extending over the channel region, the select gate of the cells along each row being connected together to form a wordline;
    a plurality of data lines, each data line being coupled to the drain region of a plurality of cells along at least a portion of a column of cells; and
    a plurality of source lines, each source line being coupled to a source region of a plurality of cells along at least a portion of a row of cells, wherein a selected memory cell is biased so that a threshold voltage of the selected memory cell is increased by injection of hot electrons from a portion of the channel region near the source region to the floating gate.

7. The structure of claim 6 wherein a selected memory cell is biased so that a threshold voltage of the selected memory cell is decreased by tunneling of electrons from the floating gate to the drain region.

8. The structure of claim 6 wherein said threshold voltage of the selected cell is increased by applying a negative voltage to a selected data line to which the drain of the selected memory cell is coupled, a positive voltage to a word line to which the selected gate of the selected memory cell is coupled, and a reference voltage to a source line to which the source of the selected memory cell is coupled.

9. The structure of claim 8 wherein the negative voltage is in the range of −4.5V to −5.5V, the positive voltage is in the range of 4.5V to 5.5V, and the reference voltage is a voltage in the range of −0.5 to +0.5V.

10. The structure of claim 8 wherein a magnitude of a negative voltage applied to unselected wordlines is greater than a magnitude of the negative voltage applied to the selected data line.

11. A method of operating a memory array having a plurality of memory cells arranged along rows and columns, each memory cell having a source region spaced apart from a drain region to form a channel region therebetween, and a floating gate and select gate stack extending over the channel region, the memory array comprising a plurality of data lines, each data line being coupled to a drain region of each of a plurality of non-volatile memory cells along a column, a plurality of source lines, each source line being coupled to a source region of each of a plurality of memory cells along a row, the method comprising:

provided a voltage representing the data to be programmed in the selected cell on a preselected data line coupled to the selected cell, wherein a threshold voltage of the selected memory cell is increased by injection of hot electrons from a portion of the selected cell's channel region substantially near the source region to the selected cell's floating gate.

12. The method of claim 11 further comprising:

providing a predesignated erase voltage on a preselected data line coupled to a selected cell, wherein a threshold voltage of the selected memory cell is decreased by tunneling of electrons from the floating gate to the drain region.

13. The method of claim 11 wherein the voltage representing the data to be programmed is a negative voltage.

14. The method of claim 13 wherein the select gates of the memory cells along each row are coupled together to form a wordline, the method further comprising:

applying a positive voltage to a selected word line to which the selected cell is connected; and applying a reference voltage to a source line to which the selected cell is connected.

15. The method of claim 14 wherein the negative voltage is in the range of −4.5V to −5.5V, the positive voltage is in the range of 4.5V to 5.5V, and the reference voltage is in the range of −0.5 to +0.5V.

16. The method of claim 14 wherein a magnitude of a negative voltage applied to unselected wordlines is greater than a magnitude of the negative voltage applied to the preselected data line.

* * * * *